(12) United States Patent
Schmenn et al.

(10) Patent No.: US 9,543,208 B2
(45) Date of Patent: Jan. 10, 2017

(54) METHOD OF SINGULATING SEMICONDUCTOR DEVICES USING ISOLATION TRENCHES

(71) Applicant: Infineon Technologies AG, Neubiberg (DE)

(72) Inventors: Andre Schmenn, Sachsenkam (DE); Damian Sojka, Regensburg (DE); Isabella Goetz, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 33 days.

(21) Appl. No.: 14/188,355

(22) Filed: Feb. 24, 2014

(65) Prior Publication Data

US 2015/0243561 A1 Aug. 27, 2015

(51) Int. Cl.
| | |
|---|---|
| *H01L 21/762* | (2006.01) |
| *H01L 21/82* | (2006.01) |
| *H01L 21/765* | (2006.01) |
| *H01L 29/06* | (2006.01) |
| *H01L 21/301* | (2006.01) |

(52) U.S. Cl.
CPC .............. *H01L 21/82* (2013.01); *H01L 21/765* (2013.01); *H01L 29/0649* (2013.01)

(58) Field of Classification Search
CPC ....... H01L 21/762; H01L 21/76224–21/76229; H01L 21/76251; H01L 21/76256
See application file for complete search history.

(56) References Cited

U.S. PATENT DOCUMENTS

| | | | |
|---|---|---|---|
| 5,940,721 A | 8/1999 | Kinzer et al. | |
| 6,353,267 B1 * | 3/2002 | Ohuchi | H01L 21/6836 257/690 |
| 6,365,485 B1 * | 4/2002 | Shiao | H01L 27/1087 438/249 |
| 6,368,941 B1 * | 4/2002 | Chen | H01L 21/76235 257/510 |
| 7,888,722 B2 * | 2/2011 | Cheng | H01L 27/10829 257/244 |
| 8,384,224 B2 * | 2/2013 | Ding | H01L 21/6835 257/774 |
| 9,385,230 B2 * | 7/2016 | Shimomura | H01L 29/7827 |
| 2001/0036704 A1 * | 11/2001 | Hueting | H01L 29/0649 438/270 |
| 2003/0211683 A1 * | 11/2003 | Kim | H01L 21/763 438/221 |
| 2004/0130001 A1 * | 7/2004 | Headley | H01L 21/78 257/620 |
| 2006/0051931 A1 * | 3/2006 | Wellhausen | H01L 27/1087 438/424 |

(Continued)

*Primary Examiner* — William F Kraig
*Assistant Examiner* — Maliheh Malek
(74) *Attorney, Agent, or Firm* — Slater Matsil, LLP

(57) ABSTRACT

In accordance with an embodiment of the present invention, a method for forming a semiconductor device includes forming a device region in a substrate. The device region extends continuously from one sidewall of the substrate to an opposite sidewall of the substrate. The method further includes forming trenches in the substrate. The trenches divide the device region into active regions. The method also includes singulating the substrate by separating the substrate along the trenches.

26 Claims, 13 Drawing Sheets

(56) References Cited

U.S. PATENT DOCUMENTS

| | | | | |
|---|---|---|---|---|
| 2006/0068567 A1* | 3/2006 | Beyne | H01L 21/78 | 438/460 |
| 2007/0034911 A1* | 2/2007 | Kao | H01L 29/41741 | 257/288 |
| 2007/0045769 A1* | 3/2007 | Bian | H01L 27/11521 | 257/510 |
| 2007/0059502 A1* | 3/2007 | Wang | C23C 14/046 | 428/209 |
| 2009/0026559 A1* | 1/2009 | Detry | B81C 1/00365 | 257/414 |
| 2009/0289291 A1* | 11/2009 | Cheng | H01L 21/84 | 257/301 |
| 2010/0230747 A1* | 9/2010 | Barletta | H01L 29/42368 | 257/334 |
| 2011/0031633 A1* | 2/2011 | Hsu | H01L 21/76898 | 257/777 |
| 2011/0041890 A1* | 2/2011 | Sheats | H01L 31/02243 | 136/244 |
| 2011/0104480 A1* | 5/2011 | Malekos | H05H 6/00 | 428/336 |
| 2011/0124145 A1* | 5/2011 | Moslehi | H01L 31/042 | 438/62 |
| 2011/0207323 A1* | 8/2011 | Ditizio | B81C 1/00087 | 438/675 |
| 2012/0146133 A1* | 6/2012 | Hirler | H01L 21/76898 | 257/330 |
| 2012/0261714 A1* | 10/2012 | Taketani | H01L 21/28211 | 257/139 |
| 2013/0099308 A1* | 4/2013 | Gruber | H01L 21/76224 | 257/330 |
| 2013/0193548 A1* | 8/2013 | Kim | H01L 21/76229 | 257/506 |
| 2013/0320567 A1* | 12/2013 | Thacker | H01L 24/94 | 257/777 |
| 2014/0110374 A1* | 4/2014 | Brencher | H01L 21/31116 | 216/67 |
| 2014/0203410 A1* | 7/2014 | Zhang | H01L 21/78 | 257/620 |
| 2014/0227856 A1* | 8/2014 | Park | H01L 21/76224 | 438/425 |
| 2014/0327068 A1* | 11/2014 | Gamerith | H01L 29/0619 | 257/329 |
| 2014/0361354 A1* | 12/2014 | Ting | H01L 27/10876 | 257/288 |
| 2014/0363979 A1* | 12/2014 | Or | H01L 21/02046 | 438/714 |
| 2014/0368965 A1* | 12/2014 | Kondo | H01C 1/14 | 361/278 |
| 2015/0061007 A1* | 3/2015 | Yang | H01L 29/7802 | 257/337 |
| 2015/0069591 A1* | 3/2015 | Fischer | H01L 21/7685 | 257/676 |
| 2015/0091183 A1* | 4/2015 | Fischer | H01L 21/76877 | 257/774 |
| 2015/0162277 A1* | 6/2015 | Zhang | H01L 23/5226 | 257/773 |
| 2015/0162278 A1* | 6/2015 | Zhang | H01L 21/76879 | 257/773 |
| 2015/0221523 A1* | 8/2015 | Zundel | H01L 21/32133 | 257/734 |
| 2015/0243561 A1* | 8/2015 | Schmenn | H01L 21/82 | 257/506 |
| 2015/0380608 A1* | 12/2015 | Lowenthal | H01L 33/38 | 257/13 |

\* cited by examiner

METHOD OF SINGULATING SEMICONDUCTOR DEVICES USING ISOLATION TRENCHES

TECHNICAL FIELD

The present invention relates generally to semiconductor devices, and, in particular embodiments, to semiconductor devices and methods of formation thereof.

BACKGROUND

Semiconductor devices are used in many electronic and other applications. Semiconductor devices may comprise integrated circuits that are formed on semiconductor wafers. Alternatively, semiconductor devices may be formed as monolithic devices, e.g., discrete devices. Semiconductor devices are formed on semiconductor wafers by depositing many types of thin films of material over the semiconductor wafers, patterning the thin films of material, doping selective regions of the semiconductor wafers, etc.

In a conventional semiconductor fabrication process, a large number of semiconductor devices are fabricated in a single wafer. At the preliminary stage of fabrication, a field oxide is grown and patterned to open active regions while covering peripheral regions. Alternatively, other types of isolation regions may be formed to form the active regions. The open active regions are processed, for example, doped with dopants to form device regions. IN particular, in such processing, the formation of the active regions precedes any other processing to form the device regions. After completion of device level and interconnect level fabrication processes, the semiconductor devices on the wafer are separated. For example, the wafer may undergo singulation. During singulation, the wafer is mechanically treated and the semiconductor devices are physically separated to form individual dies.

SUMMARY OF THE INVENTION

In accordance with an embodiment of the present invention, a method for forming a semiconductor device comprises forming a device region in a substrate. The device region extends continuously from one sidewall of the substrate to an opposite sidewall of the substrate. The method further includes forming trenches in the substrate. The trenches divide the device region into active regions. The method also includes singulating the substrate by separating the substrate along the trenches.

In accordance with an embodiment of the present invention, a method for forming a semiconductor device comprises forming a device region in a substrate before using an active mask step. After forming the device region, gaps are formed along dicing channels in the substrate. The gaps divide the device region into a plurality of active regions. Using the gaps, the substrate is singulated.

In accordance with an embodiment of the present invention, a semiconductor device includes a device region extending from one sidewall to another sidewall of a substrate. The sidewall has a first portion and a second portion offset from the first portion by a minor surface parallel to a major surface of the substrate. An insulating liner extends along a top part of the first portion of the sidewall. The minor surface remains exposed.

BRIEF DESCRIPTION OF THE DRAWINGS

For a more complete understanding of the present invention, and the advantages thereof, reference is now made to the following descriptions taken in conjunction with the accompanying drawings, in which:

FIG. 1, which includes FIGS. 1A and 1B, illustrates a semiconductor device fabricated in accordance with an embodiment of the present invention, wherein FIG. 1A illustrates a cross-sectional view while FIG. 1B illustrates a top view;

FIG. 2, which includes FIGS. 2A and 2B, illustrates a semiconductor substrate during an initial stage of fabrication in accordance with an embodiment of the present invention, wherein FIG. 2A illustrates a cross-sectional view of a portion of the substrate while FIG. 2B illustrates a top view of the substrate;

FIG. 4, which includes FIGS. 4A and 4B, illustrates the semiconductor device after forming trenches during a subsequent stage of processing in accordance with an embodiment of the present invention, wherein FIG. 4A illustrates a cross-sectional area of a portion of the semiconductor device and FIG. 4B illustrates a top view;

FIG. 21, which includes

DETAILED DESCRIPTION OF ILLUSTRATIVE EMBODIMENTS

The cost of a semiconductor device depends amongst other things on the number of process steps and masks used to form the semiconductor device. Many applications for semiconductor devices are very cost sensitive. Therefore, reducing the number of process steps is a driving force in development of such devices. Embodiments of the present invention may be applied to various semiconductor devices, for example, discrete devices such as PIN diodes, TVS diodes, capacitors, resistors, transistors, and others. For example, electro static discharge (ESD) protection diodes are increasingly used to protect many different types of devices. However, these devices are usually produced with relatively complex processes resulting in high production costs for these devices.

Embodiments of the present invention overcome these and other problems by reducing the number of process steps during device fabrication. Additionally, embodiments of the invention improve the performance of the ESD devices by increasing the area of the active regions relative to the size of the chip. Alternatively, embodiments of the invention increase the number of chips per wafer further reducing the cost of a device.

A structural embodiment of the present invention will be described using FIG. 1. An alternative embodiment will be described in FIG. 8. Further structural embodiments will be described using FIGS. 13, 15, 18, and 21. A method of forming the protection device will be described using FIGS. 2-8. Alternative methods of forming the protection device will be described using FIGS. 9-13, FIGS. 14-15, FIGS. 16-18, and FIGS. 19-21.

Figure 1A:
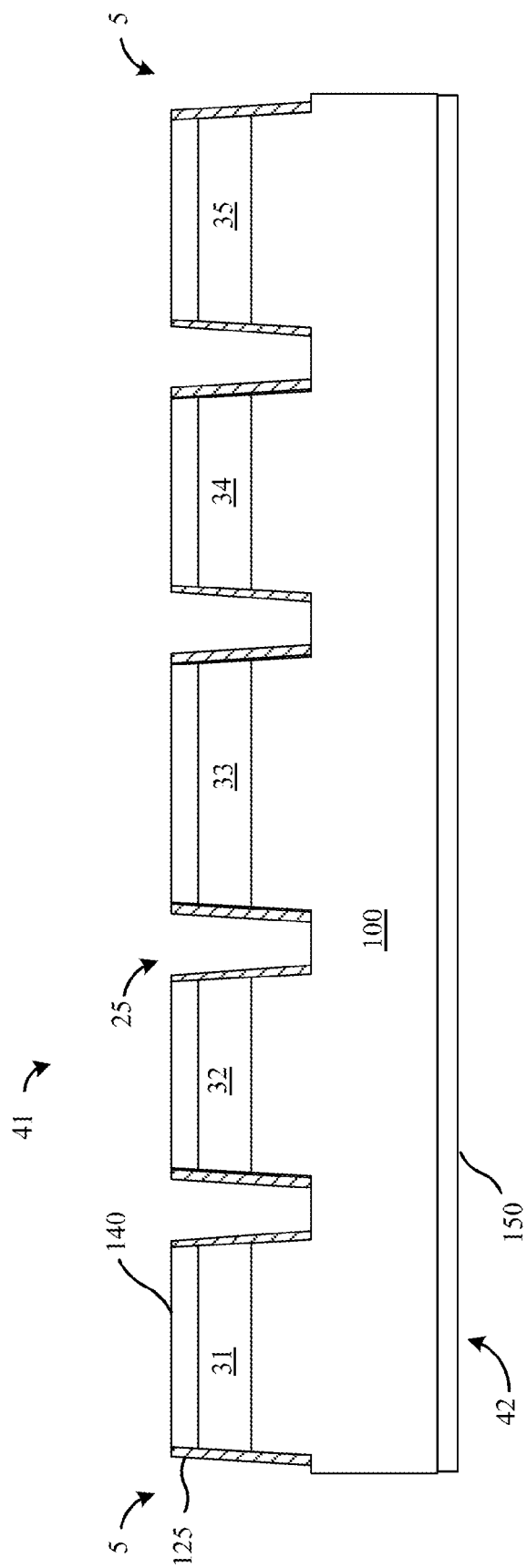
Figure 1B:
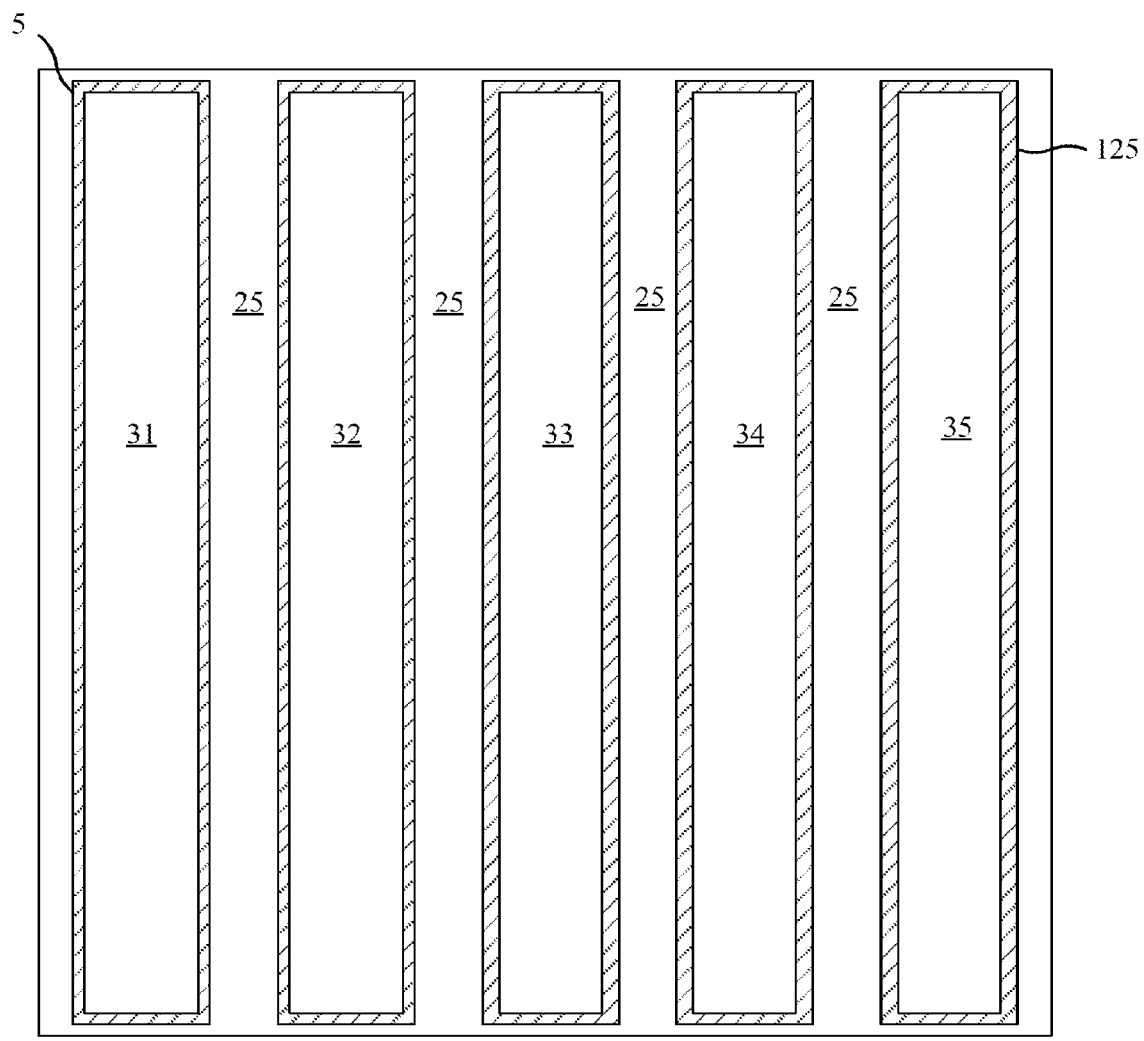

FIG. 1, which includes FIGS. 1A and 1B, illustrates a semiconductor device fabricated in accordance with an embodiment of the present invention. FIG. 1A illustrates a cross-sectional view while FIG. 1B illustrates a top view.

Referring to FIG. 1A, the semiconductor comprises a first vertical device 31, a second vertical device 32, a third vertical device 33, a fourth vertical device 34, and a fifth vertical device 35 disposed in a substrate 100. In some embodiments, more number of devices may be disposed in the substrate 100. In various embodiments, the first vertical device 31, the second vertical device 32, the third vertical device 33, the fourth vertical device 34, and the fifth vertical device 35 may be similar or different types of devices. However, these devices are not coupled to each other from the front side 41 but are coupled to each other through the back side 42. In various embodiments, the first, the second, the third, the fourth, and the fifth vertical devices 31-35 are vertical devices but in alternative embodiments may be lateral devices provided they are discrete device with separate contacts at the front side 41.

In one embodiment, the first, the second, the third, the fourth, and the fifth vertical devices 31-35 are devices for electrostatic discharge protection. In one or more embodiments, the first, the second, the third, the fourth, and the fifth vertical devices 31-35 are two terminal devices. Alternatively, in some embodiments, one or more of the first, the second, the third, the fourth, and the fifth vertical devices 31-35 may be a three terminal device. In one or more embodiments, the first, the second, the third, the fourth, and the fifth vertical devices 31-35 may be a diode. Although, in alternative embodiments, the first, the second, the third, the fourth, and the fifth vertical devices 31-35 may include one or more transistors.

In various embodiments, the first, the second, the third, the fourth, and the fifth vertical devices 31-35 are fabricated using a process with a small number of mask steps (e.g., less than five lithography steps). Accordingly, using embodiments of the present invention reduces the number of mask steps thereby lowering the cost of fabrication. For example, reducing the number of mask steps from five to three results in roughly a 40% decrease in process costs.

FIGS. 2-8 illustrate a semiconductor device during various stages of fabrication in accordance with embodiments of the present invention.

Figure 2A:
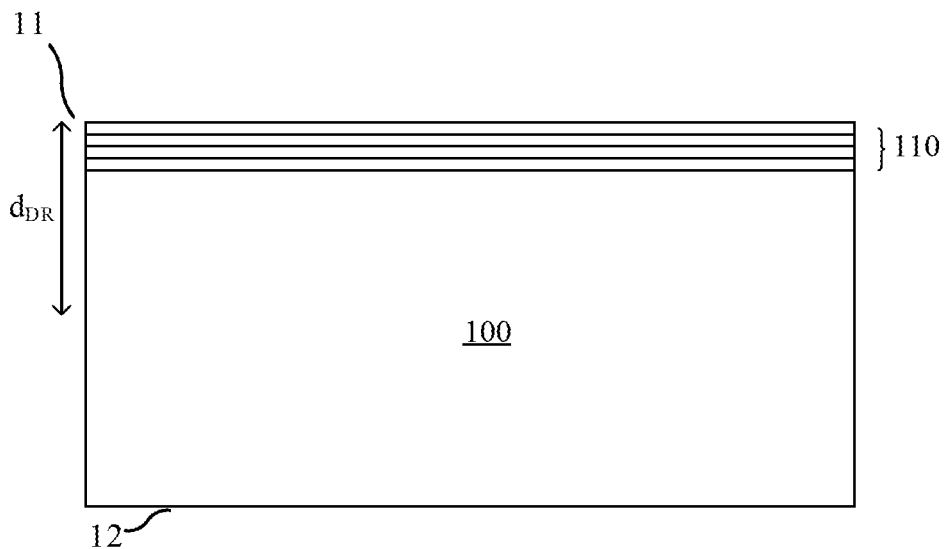
Figure 2B:
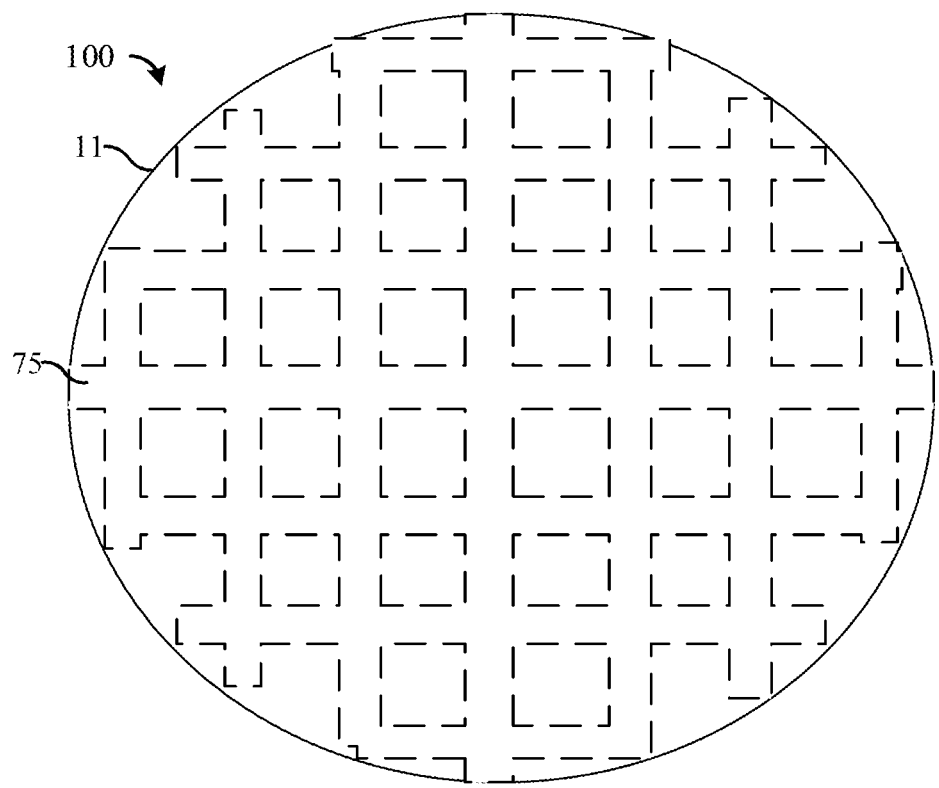

FIG. 2, which includes FIGS. 2A and 2B, illustrates a semiconductor substrate during an initial stage of fabrication in accordance with an embodiment of the present invention. FIG. 2A illustrates a cross-sectional view of a portion of the substrate while FIG. 2B illustrates a top view of the substrate.

Referring to FIG. 2A, a semiconductor substrate 100 is illustrated. After completion of the fabrication processes, the semiconductor substrate 100 has a plurality of semiconductor devices, i.e., chips, formed within. In one embodiment, the semiconductor substrate 100 may comprise a semiconductor wafer such as a silicon wafer. In other embodiments, the semiconductor substrate 100 may comprise other semiconductor materials including alloys such as SiGe, SiC or compound semiconductor materials such as GaAs, InP, InAs, GaN, sapphire, silicon on insulation, for example. The semiconductor substrate 100 may include one or more epitaxial layers including homo-epitaxial layers.

Referring to FIG. 2A, device regions 110 are disposed within the substrate 100. The device regions 110 may include doped regions in various embodiments. Further, some portion of the device regions 110 may be formed over the substrate 100. In various embodiments, the device regions 110 may be formed in an epitaxial layer of the substrate 100. In some embodiments, the device regions 110 may be formed using an epitaxial doping process during the epitaxial deposition process. In one or more embodiments, the device regions 110 may include p/n junction diode regions. The device regions 110 may include active regions such as channel regions of transistors in some embodiments. In case of bipolar transistors, the device regions 110 may include base, collector, and/or emitter regions.

The substrate 100 comprises a top surface 11 and an opposite bottom surface 12. In various embodiments, the device regions 110 are formed closer to the top surface 11 of the substrate 100 than the bottom surface 12. The active devices are formed in device regions 110 of the substrate 100. Device regions 110 extends over a depth $d_{DR}$, which depending on the device, is about 50 µm to about 500 µm, and about 200 µm in one embodiment.

FIG. 2B illustrates the dicing channels 75, which will be formed eventually separating the substrate 100 into separate chips. In conventional processes, the dicing channels 75 are defined early in the process using a separate masking step, e.g., active mask. In particular, in conventional processing, an active mask is used to form active regions. This is the first process mask step and performed prior to any formation of device (doped) regions. Using embodiments of the present invention, this active mask step is eliminated. However, in various embodiments, the dicing channels 75 are not formed until the singulation process. Consequently, embodiments of the present invention reduce the cost of forming the chips because multiple process steps are avoided.

Figure 3:
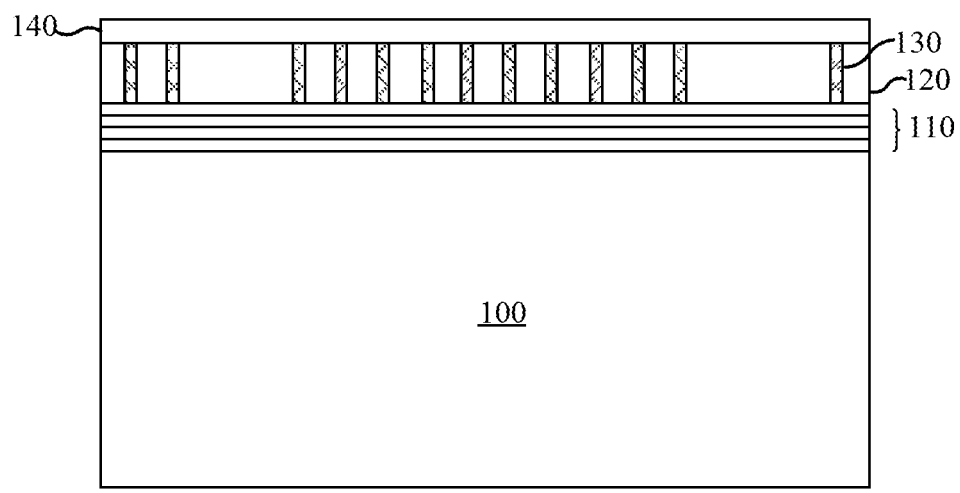
FIG. 3 illustrates a cross-sectional area of a portion of the semiconductor device after forming front side device regions during a subsequent stage of processing in accordance with an embodiment of the present invention.

FIG. 3 illustrates a cross-sectional area of a portion of the semiconductor device after forming front side device regions during a subsequent stage of processing in accordance with an embodiment of the present invention.

In various embodiments, all necessary interconnects, connections, pads etc. for coupling between devices and/or with external circuitry are formed over the substrate 100. Accordingly, a metallization layer 120 is formed over the substrate 100. The metallization layer 120 may comprise one or more levels of metallization. Each level of metallization may comprise metal lines or vias embedded within an insulating layer. The metallization layer 120 may comprise metal lines and vias formed within one or more dielectric layers so as to contact the device regions 110 and also to couple different devices within each chip in the substrate 100. For illustration, vias 130 are shown formed within the metallization layer 120. In various embodiments, the metallization layer 120 may comprise more than one metal level. In one or more embodiments, the metallization layer 120 and the associated vias 130 may be skipped.

A contact layer 140 may be formed over the substrate 100. In some embodiments, the contact layer 140 may be formed directly on the substrate 100. For example, in case of discrete diodes, the contact layer 140 may be formed so as to directly contact the device regions 110. In one or more embodiments, the contact layer 140 comprises aluminum. In an alternative embodiment, the contact layer 140 comprises copper. In one embodiment, the contact layer 140 comprises a metal silicide. In another embodiment, the contact layer 140 comprises a metal nitride such as titanium nitride, tungsten nitride, tantalum nitride. In a further alternative embodiment, the contact layer 140 comprises a solder compatible material, for example, may comprise one or more of silver, lead, tin, indium, cadmium, bismuth.

A protective layer, such as a passivation layer, may be formed over the metallization layer 120 and the contact layer 140 before further processing. The protective layer may comprise an oxide, nitride, polyimide, or other suitable materials known to one skilled in the art. The protective layer may comprise a hard mask in one embodiment, and a resist mask in another embodiment. The protective layer helps to protect the metallization layer 120, the contact layer 140 as well as the device regions 110 during subsequent processing.

Figure 4A:
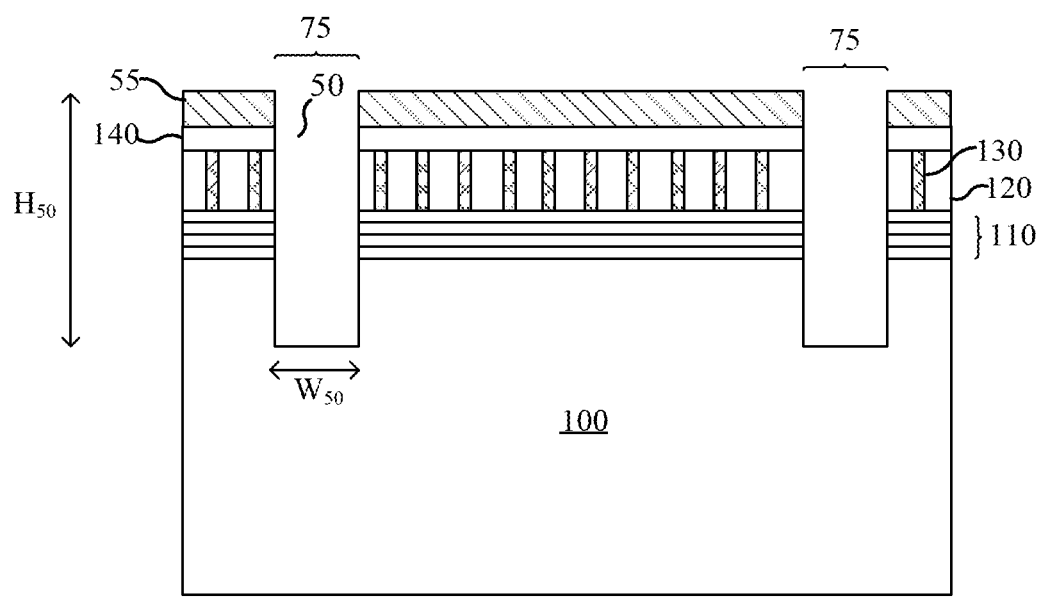
Figure 4B:
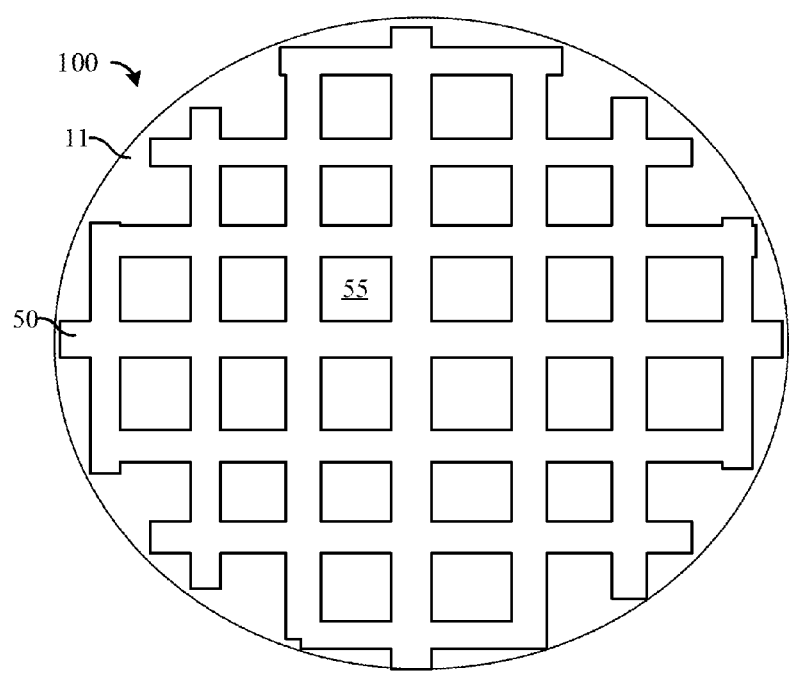

FIG. 4, which includes FIGS. 4A and 4B, illustrates the semiconductor device after forming trenches during a subsequent stage of processing in accordance with an embodiment of the present invention. FIG. 4A illustrates a cross-sectional area of a portion of the semiconductor device and FIG. 4B illustrates a top view.

Referring to FIG. 4A, a plurality of trenches 50 are formed in the substrate 100. In various embodiments, trenches 50 are formed by depositing a resist layer and optionally a hard mask layer. The hard mask layer 55 is deposited below the resist layer, which is patterned using photo lithography. The hard mask layer 55 may be subsequently patterned using the patterned resist layer using an anisotropic chemical etching process. In various embodiments, the hard mask layer 55 may be used to protect the underlying layers during the trench etch process.

After forming the patterned hard mask layer 55, in various embodiments, the plurality of trenches 50 is formed using a plasma etching process such as a reactive ion etching process. The plurality of trenches 50 are formed along the dicing channels 75 of the substrate 100. As illustrated in FIG. 4A, after the etching, the height $H_{50}$ of the plurality of trenches 50 is about 1 µm to about 50 µm, and about 2 µm in one embodiment. The width $W_{50}$ of the plurality of trenches 50 is about 1 µm to about 10 µm, and about 5 µm in one embodiment. The ratio of the height $H_{50}$ of the plurality of trenches 50 to the length $W_{50}$ of the plurality of trenches 50 is about 1:1 to about 100:1.

Figure 5:
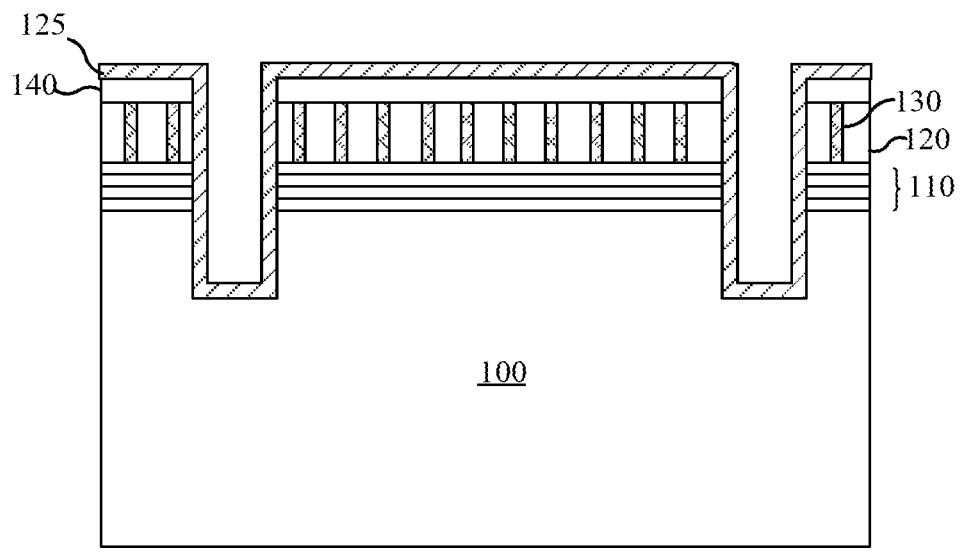
FIG. 5 illustrates the semiconductor device after depositing an insulating liner over the trench during a subsequent stage of processing in accordance with an embodiment of the present invention.

FIG. 5 illustrates the semiconductor device after depositing an insulating liner over the trench during a subsequent stage of processing in accordance with an embodiment of the present invention.

Referring to FIG. 5, an insulating liner 125 is formed over the sidewalls of the plurality of trenches 50. In various embodiments, the insulating liner 125 may be an oxide, a nitride, a low-k dielectric material including porous dielectric materials. In various embodiments, the insulating liner 125 protects the sidewalls of the trenches 50, which after singulation may be sidewalls of the chip.

Figure 6:
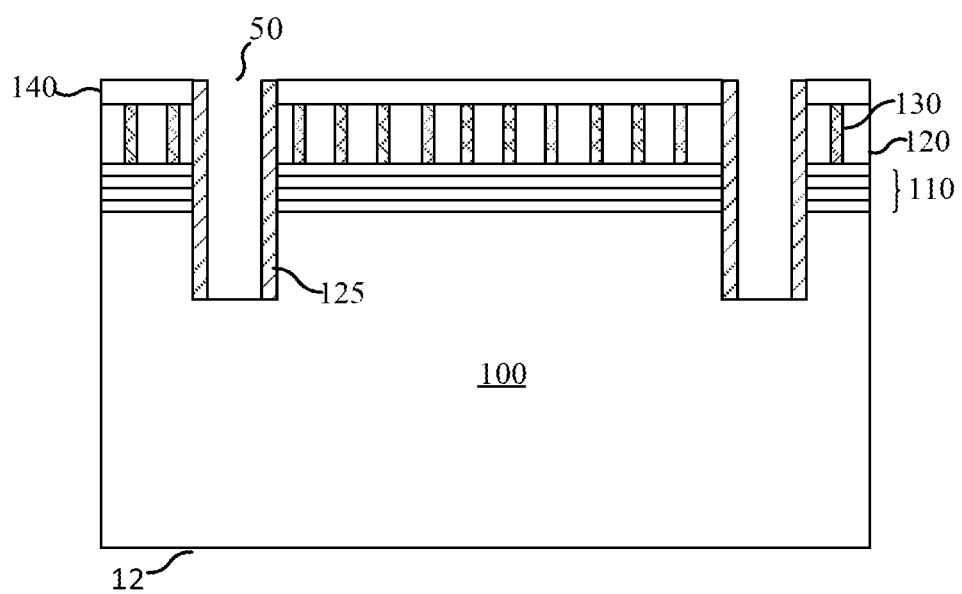
FIG. 6 illustrates the semiconductor device after etching the insulating liner from the bottom surface of the trench during a subsequent stage of processing in accordance with an embodiment of the present invention.

FIG. 6 illustrates the semiconductor device after etching the insulating liner from the bottom surface of the trench during a subsequent stage of processing in accordance with an embodiment of the present invention.

As illustrated in FIG. 6, the insulating liner 125 is removed from the bottom surface of the plurality of trenches 50. The insulating liner 125 may be removed using a chemical anisotropic etch in one or more embodiments. The etch process also removes the insulating liner 125 disposed over the contact layer 140. Thus, the insulating liner 125 forms a spacer around the sidewalls of the plurality of trenches 50 in various embodiments. In some embodiments, after forming the insulating liner 125, the plurality of trenches 50 may be plugged with a sacrificial material such as a low-k material, a carbon containing layer such as amorphous carbon and others, so as to prevent any contaminant getting into them during subsequent processing.

Figure 7:
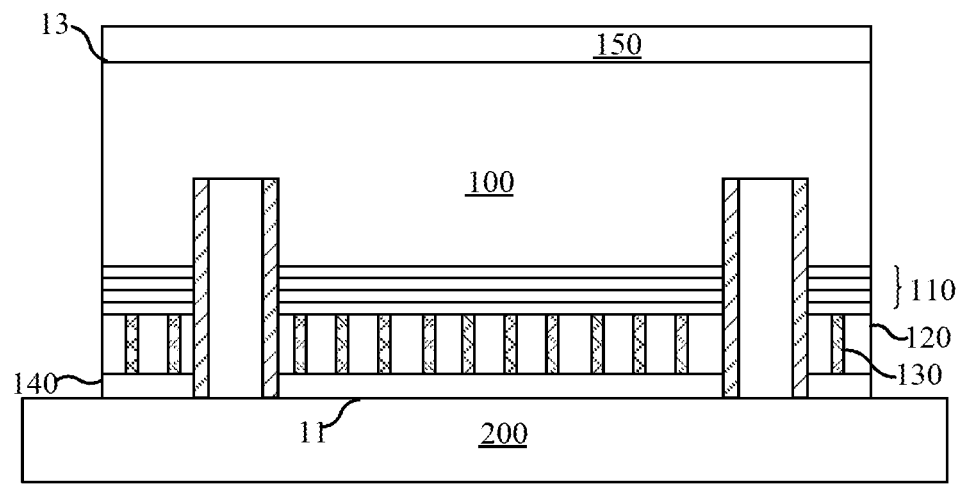
FIG. 7 illustrates the semiconductor device after forming a back side contact under the substrate during a subsequent stage of processing in accordance with an embodiment of the present invention.

FIG. 7 illustrates the semiconductor device after forming a back side contact under the substrate during a subsequent stage of processing in accordance with an embodiment of the present invention.

Referring to FIG. 7, the substrate 100 is mounted onto a carrier 200. Some embodiments may also skip the carrier 200. Further, in some embodiments, a standard grinding tape may be used as the carrier 200. The top surface 11 of the substrate 100 faces the carrier 200 after the substrate 100 is attached to the carrier 200. The bottom surface 12 of the substrate 100 is exposed to a thinning process. The thinning process may comprise a grinding process in one or more embodiments. A thinning tool, which may be a grinding tool in one embodiment, reduces the thickness of the substrate 100. In another embodiment, the thinning process may use a chemical process such as a wet etch or a plasma etch to thin the substrate 100.

In one or more embodiments, as illustrated in FIG. 7, the thinning process is stopped before reaching the bottom surface of the plurality of trenches 50. However, in some embodiments, the thinning process is stopped after reaching the bottom surface of the plurality of trenches 50. After the thinning, a new back surface 13 is exposed.

A back side contact layer 150 is formed under the new back surface 13 of the thinned substrate 100. An implant may be performed prior to forming the back side contact layer 150. The back side contact layer 150 may comprise one or more layers of metal in various embodiments.

The back side contact layer 150 may be formed as a blanket (unpatterned) metal layer in one embodiment. In another embodiment, a patterned metal layer may be formed within the back side contact layer 150. In one embodiment, redistribution lines may be formed within the back side contact layer 150. The redistribution lines may be used as interconnect on the back side, for example, coupling different circuit blocks (e.g., devices on a system on chip). In one or more embodiments, the back side contact layer 150 comprises aluminum. In an alternative embodiment, the back side contact layer 150 comprises copper. In one embodiment, the back side contact layer 150 comprises a metal silicide. In another embodiment, the back side contact layer 150 comprises a metal nitride such as titanium nitride, tungsten nitride, tantalum nitride. In a further alternative embodiment, the back side contact layer 150 comprises a solder compatible material, for example, may comprise one or more of silver, gold, lead, tin, indium, cadmium, bismuth.

Figure 8:
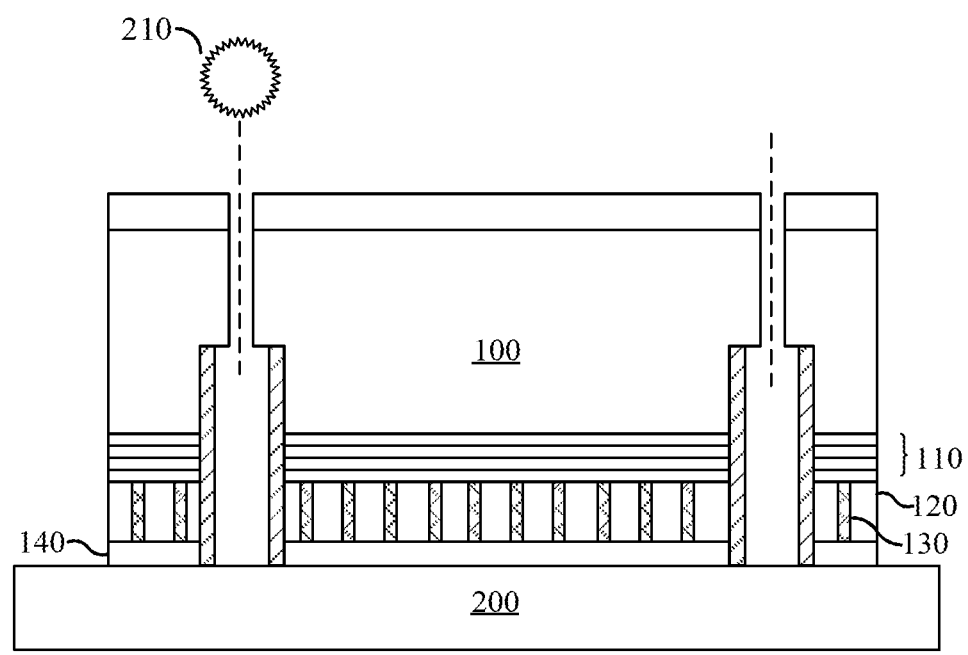
FIG. 8 illustrates the semiconductor device after singulation during a subsequent stage of processing in accordance with an embodiment of the present invention.

FIG. 8 illustrates the semiconductor device after singulation during a subsequent stage of processing in accordance with an embodiment of the present invention.

As next illustrated in FIG. 8, the substrate 100 is singulated at the dicing channels 75. In one or more embodiments, the singulation may be performed using a mechanical tool 210. Alternatively, the singulation may be performed using a laser dicing process and/or a plasma dicing process.

Accordingly, using embodiments of the present invention, sidewalls of the chips are passivated by the insulating liner 125, which also prevents shorts. Unlike a conventional process flow where such passivation is formed using a separate mask step, in embodiments of the present invention, the passivation of the sidewalls is formed in a common mask step with a mask having both an active mask and a dicing mask.

FIGS. 9-13 illustrate the semiconductor device during various stages of fabrication in an alternative embodiment of present invention.

In this embodiment, the plurality of trenches 50 forms the complete sidewall of the chip. However, in this embodiment, the plurality of trenches 50 are formed deep into the substrate using a plasma etch.

Figure 9:
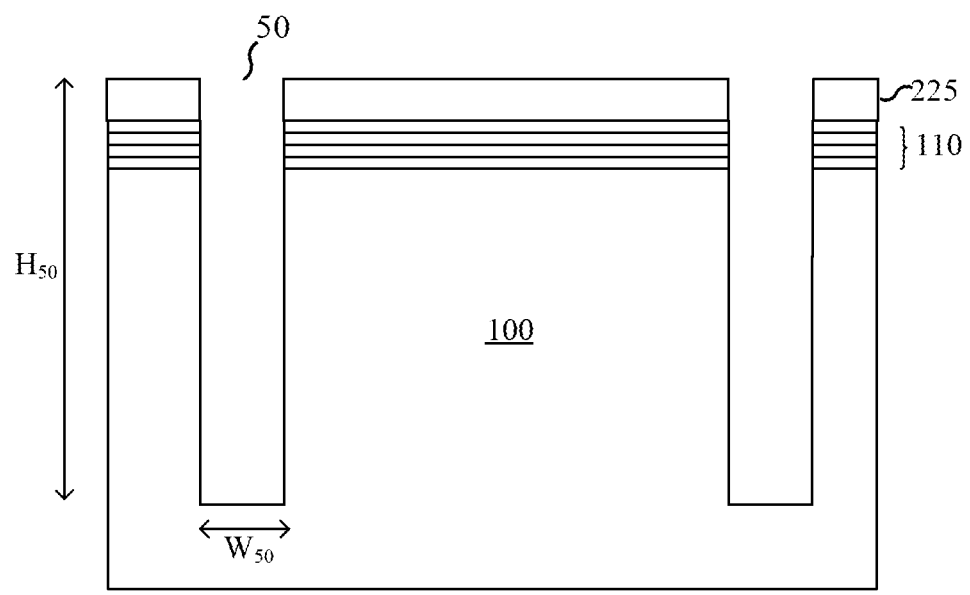
FIG. 9 illustrates a cross-sectional view of a semiconductor device after forming front side device regions during a stage of processing in accordance with an alternative embodiment of the present invention.

FIG. 9 illustrates a cross-sectional view of a semiconductor device after forming front side device regions during a stage of processing in accordance with an embodiment of the present invention.

Referring now to FIG. 9, after forming device regions 110, a plurality of trenches 50 are formed. In one or more embodiments, the plurality of trenches 50 extends beyond the depth of the device regions 110. The plurality of trenches 50 may be formed using a plasma etching process. In various embodiments, a high density plasma may be used to form the plurality of trenches 50. Accordingly, the plasma tool is a high density plasma etch tool, for example, an microwave generator plasma tool or alternatively an inductively coupled plasma tool. Additionally remote plasma generated by a microwave plasma generation unit may be used in some embodiments.

In various embodiments, the plasma is formed from a mixture of tetra-fluoro-methane ($CF_4$) and oxygen. In an etch chemistry comprising $CF_4$, the addition of $O_2$ results in creation of more free fluorine radicals that increases the reactivity of the plasma. Alternatively, in some embodiments, a low density plasma process may be used to form the plurality of trenches 50.

As illustrated in FIG. 9, after the etching, the height $H_{50}$ of the plurality of trenches 60 is about 50 µm to about 500 µm, and about 200 µm in one embodiment. The width $W_{50}$ of the plurality of trenches 50 is about 1 µm to about 50 µm, and about 20 µm in one embodiment. The ratio of the height $H_{50}$ of the plurality of trenches 50 to the length $W_{50}$ of the plurality of trenches 50 is about 5:1 to about 100:1. Thus, the plurality of trenches 50 are deep trenches with high aspect ratios.

Figure 10:
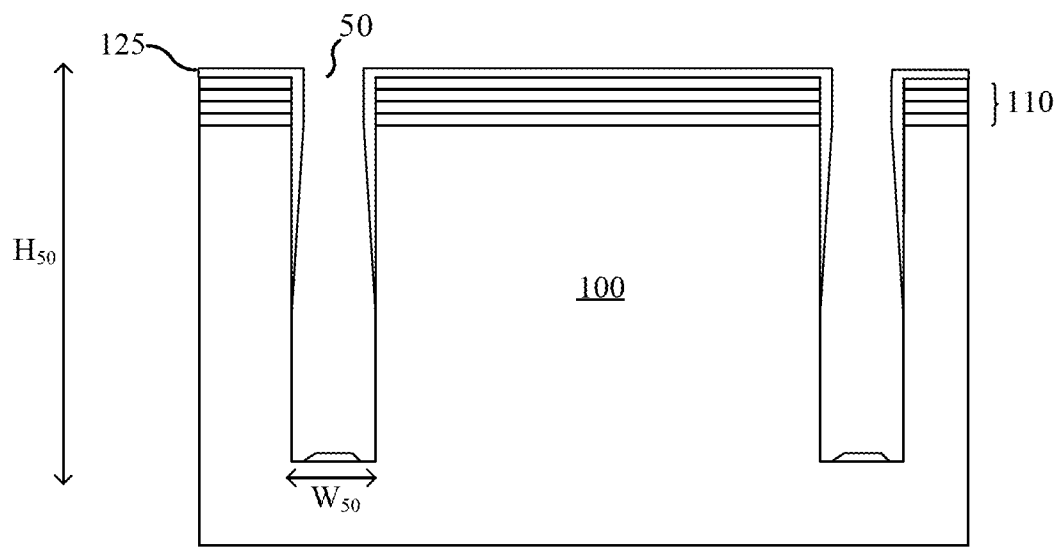
FIG. 10 illustrates a cross-sectional view of a semiconductor device after forming front side metallization during a stage of processing in accordance with the alternative embodiment of the present invention.

FIG. 10 illustrates a cross-sectional view of a semiconductor device after forming front side metallization during a stage of processing in accordance with an embodiment of the present invention.

An insulating liner 125 is formed over the substrate 100. The insulating liner 125 may comprise an oxide, nitride, polyimide, or other suitable materials known to one skilled in the art. The insulating liner 125 may not formed along the lower sidewalls of the plurality of trenches 50 in some embodiments. This is because of the large aspect ratio (height to width ratio greater than about 10:1) of the plurality of trenches 50.

Figure 11:
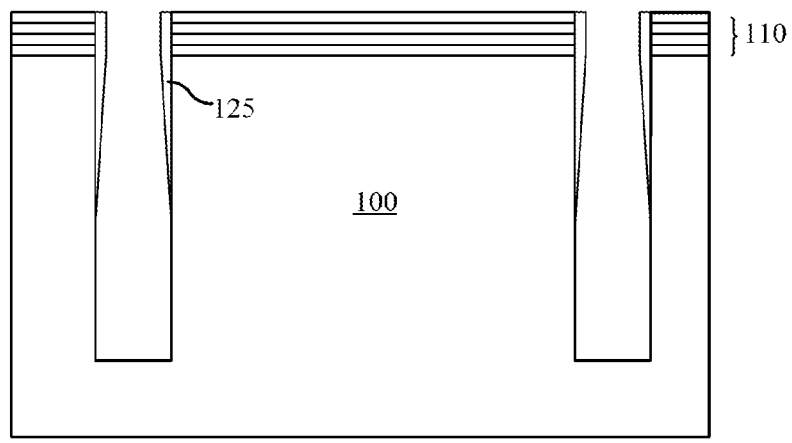
FIG. 11 illustrates a cross-sectional view of a semiconductor device after an anisotropic etch process during a stage of processing in accordance with the alternative embodiment of the present invention.

FIG. 11 illustrates a cross-sectional view of a semiconductor device after an anisotropic etch process during a stage of processing in accordance with an embodiment of the present invention.

An anisotropic etch process is performed to remove the insulating liner 125 from over the top surface of the device regions 110. The etching process may also remove any remaining insulating liner 125 formed at the bottom of the plurality of trenches 50. In one or more embodiments, the insulating liner 125 may be removed using a reaction ion etch process.

Figure 12:
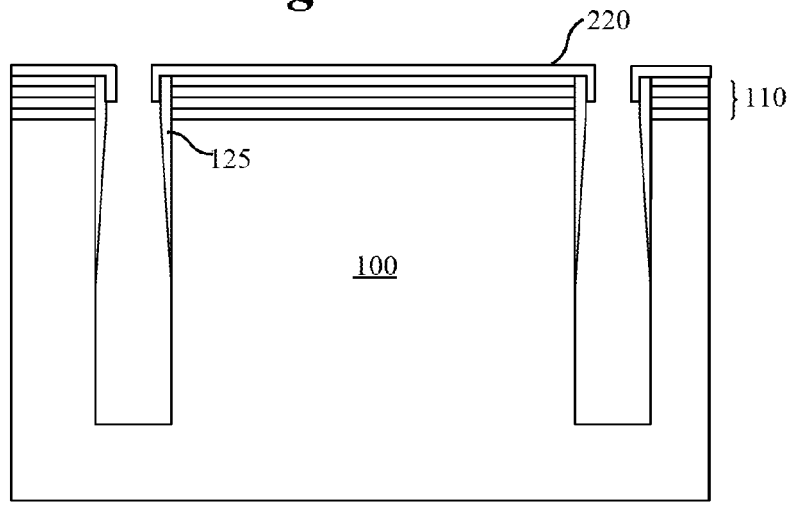
FIG. 12 illustrates a cross-sectional view of a semiconductor device after forming front side metallization during a stage of processing in accordance with the alternative embodiment of the present invention.

FIG. 12 illustrates a cross-sectional view of a semiconductor device after forming front side metallization during a stage of processing in accordance with an embodiment of the present invention.

Referring to FIG. 12, a front side metallization layer 220 is formed over the insulating liner 125. The front side metallization layer 220 may comprise one or more metal layers in various embodiments. In various embodiments, the front side metallization layer 220 comprises aluminum. In one or more embodiments, the front side metallization layer 220 comprises a solderable material.

The front side metallization layer 220 may be formed using a deposition process including sputter deposition, chemical vapor deposition, physical vapor deposition, plasma enhanced vapor deposition, and other vapor deposition techniques, electrochemical deposition process, and others. In various embodiments, the metal does not reach the lower sidewalls of the substrate 100 because of the high aspect ratio of the plurality of trenches 50.

Figure 13:
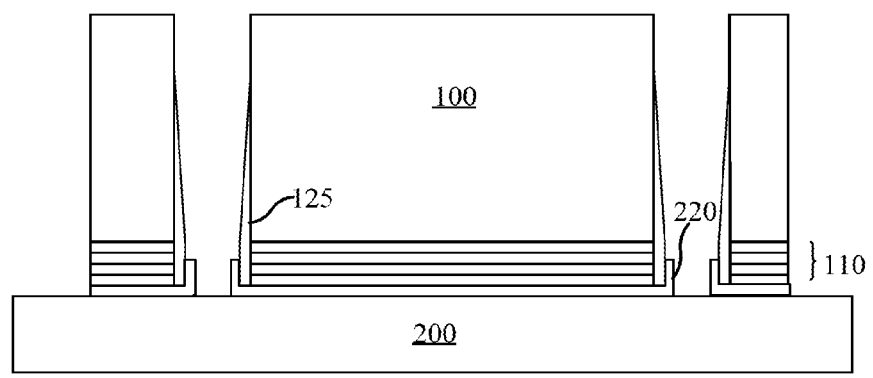
FIG. 13 illustrates a cross-sectional view of a semiconductor device during processing after back side thinning of the substrate in accordance with the alternative embodiment of the present invention.

FIG. 13 illustrates a cross-sectional view of a semiconductor device during processing after back side thinning of the substrate in accordance with an embodiment of the present invention.

As next illustrated in FIG. 13, the substrate 100 is mounted on a carrier 200 and thinned until the bottom surface of the plurality of trenches 50 is reached. Accordingly, the substrate 100 is singulated during the thinning process.

Figure 14:
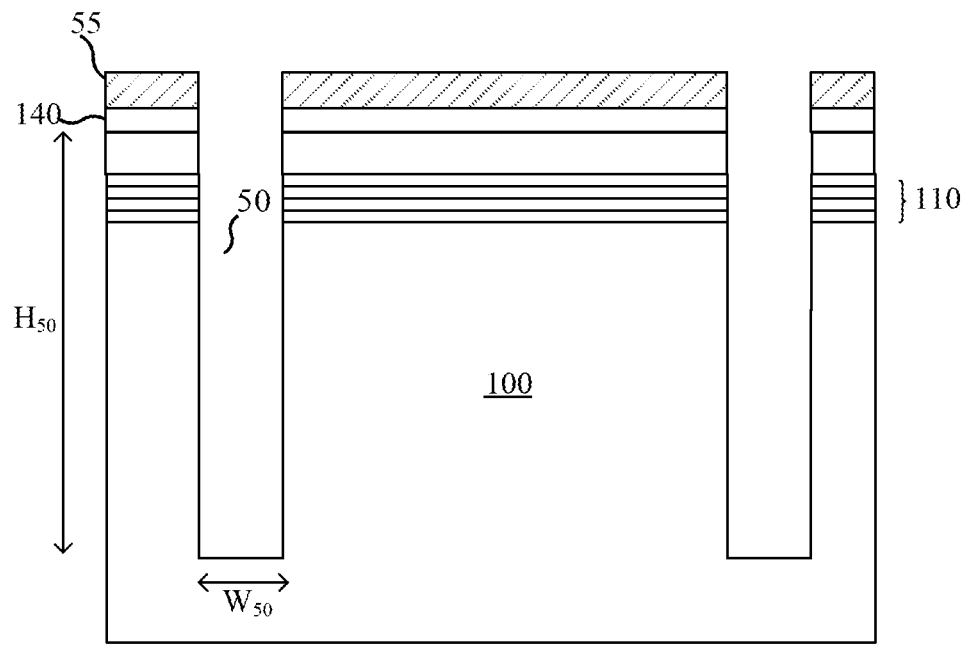
FIG. 14 illustrates a cross-sectional view of a semiconductor device during processing after forming deep trenches in the substrate in accordance with a second alternative embodiment of the present invention.
Figure 15:
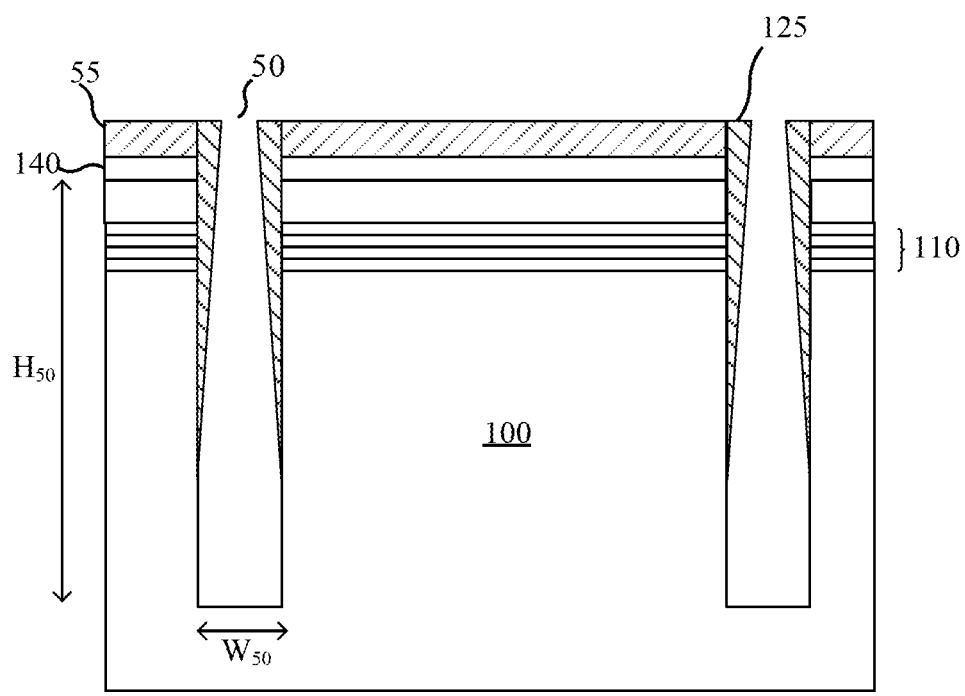
FIG. 15 illustrates a cross-sectional view of a semiconductor device during processing after forming insulating liner covering at last a top portion of the sidewalls of the deep trenches in accordance with the second alternative embodiment of the present invention.

FIGS. 14-15 illustrate a semiconductor during various stages of fabrication in accordance with an alternative embodiment of the present invention.

FIG. 14 illustrates a cross-sectional view of a semiconductor device during processing after forming deep trenches in the substrate in accordance with an embodiment of the present invention.

In this embodiment, a plurality of trenches 50 are formed after forming the device regions 110, the optional metallization layer 120, and the contact layer 140. A hard mask layer 55 is formed over the contact layer 140 and patterned for the plurality of trenches 50.

FIG. 15 illustrates a cross-sectional view of a semiconductor device during processing after forming insulating liner covering at last a top portion of the sidewalls of the deep trenches in accordance with an embodiment of the present invention.

An insulating liner 125 is formed along sidewalls of the plurality of trenches 50. The substrate 100 may be thinned and singulated as described in earlier embodiments. For example, subsequent processing may proceed as described using FIGS. 7-8 or alternatively using FIGS. 12-13.

Figure 16:
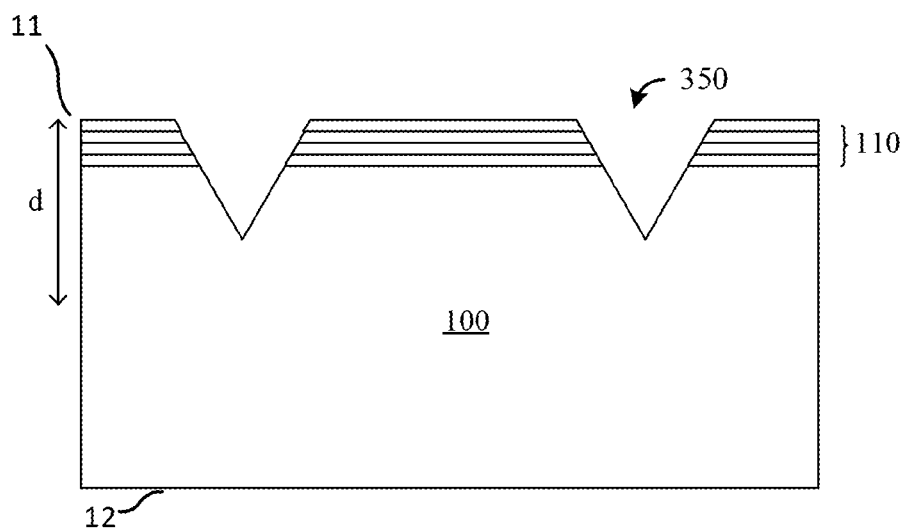
FIG. 16 illustrates a cross-sectional view of a semiconductor device during processing after forming a "V-shaped" groove within the substrate in accordance with a third alternative embodiment of the present invention.
Figure 17:
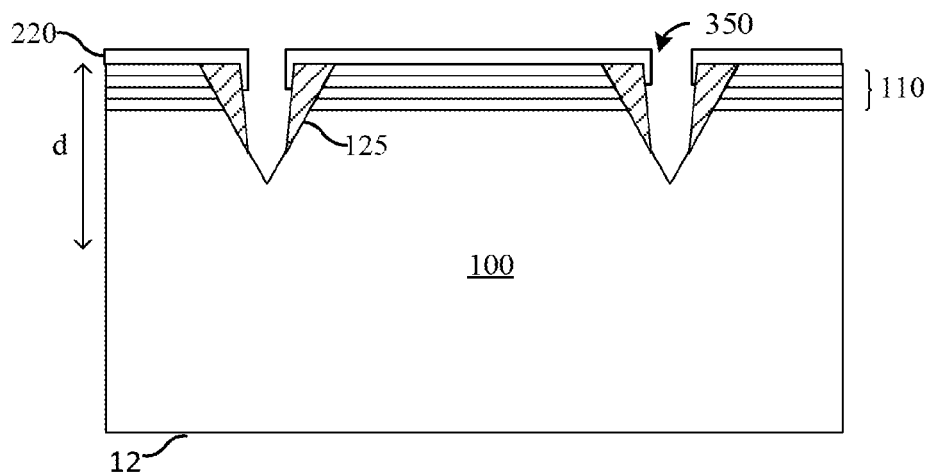
FIG. 17 illustrates a cross-sectional view of a semiconductor device during processing after forming an insulating liner over a top portion of the "V-shaped" groove within the substrate in accordance with the third alternative embodiment of the present invention.
Figure 18:
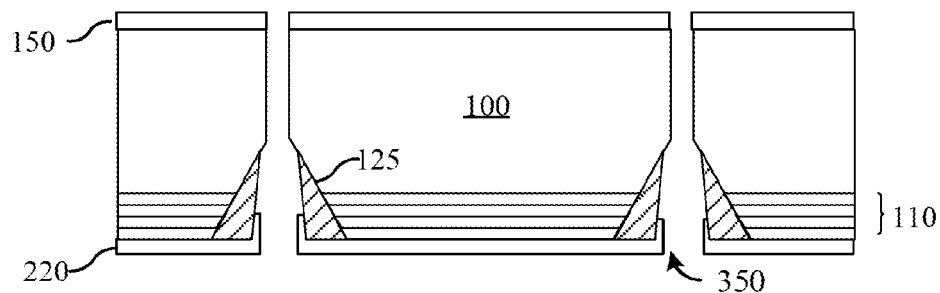
FIG. 18 illustrates a cross-sectional view of a semiconductor device after thinning the substrate in accordance with the third alternative embodiment of the present invention.

FIGS. 16-18 illustrate a semiconductor device during various stages of processing in accordance with an alternative embodiment of the present invention.

FIG. 16 illustrates a cross-sectional view of a semiconductor device during processing after forming a "V-shaped" groove within the substrate in accordance with an alternative embodiment of the present invention.

In this embodiment, a plurality of grooves 350 is formed in the substrate 100. Depending on the etch process, the plurality of grooves 350 may be formed as a "V-shaped" opening or alternatively as a trapezoidal opening. However, as in prior embodiments, the plurality of grooves 350 extends across the substrate 100 along the dicing channels, for example, as illustrated in the top view of FIG. 4B. In one or more embodiments, the plurality of grooves 350 may be formed using an etch process such as a crystallographic etching process that etches preferentially along specific crystal directions. For example, potassium hydroxide or tetra-methyl ammonium hydroxide may be used in various embodiments. In alternative embodiments, the plurality of grooves 350 may be formed using other processes such as laser dicing.

FIG. 17 illustrates a cross-sectional view of a semiconductor device during processing after forming an insulating liner over a top portion of the "V-shaped" groove within the substrate in accordance with an alternative embodiment of the present invention.

As described in prior embodiments, an insulating liner 125 is formed over the plurality of grooves 350. The insulating liner 125 may be formed using a combination of deposition and anisotropic etching process as described previously. In embodiments in which the plurality of grooves 350 are formed before forming a contact metal layer, a front side metallization layer 220 is formed over the device regions 110.

FIG. 18 illustrates a cross-sectional view of a semiconductor device after thinning the substrate in accordance with an alternative embodiment of the present invention.

The substrate 100 may be thinned from the back side. The thinning may complete the singulation in some embodiments. In alternative embodiments, a subsequent singulation process (e.g., sawing) is performed.

Figure 19:
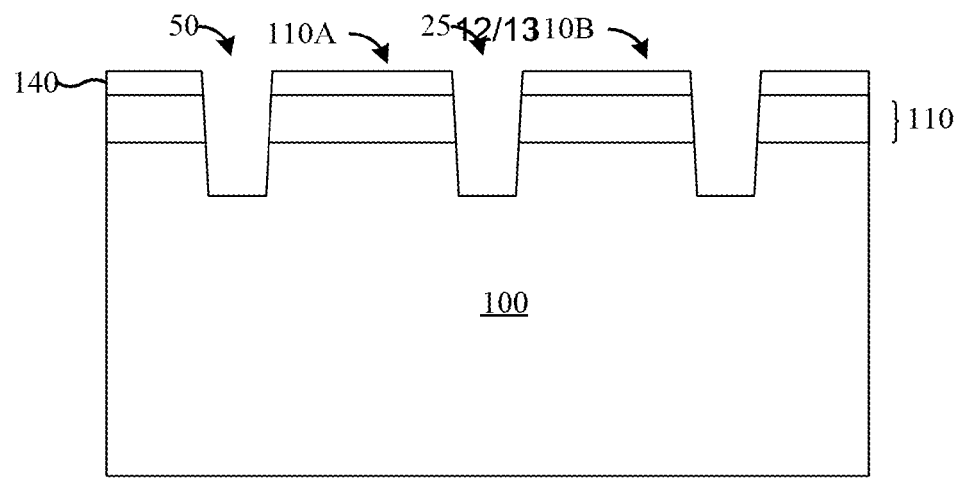
FIG. 19 illustrates a cross-sectional view of a semiconductor device after forming trenches in the substrate in accordance with a fourth alternative embodiment of the present invention.
Figure 20:
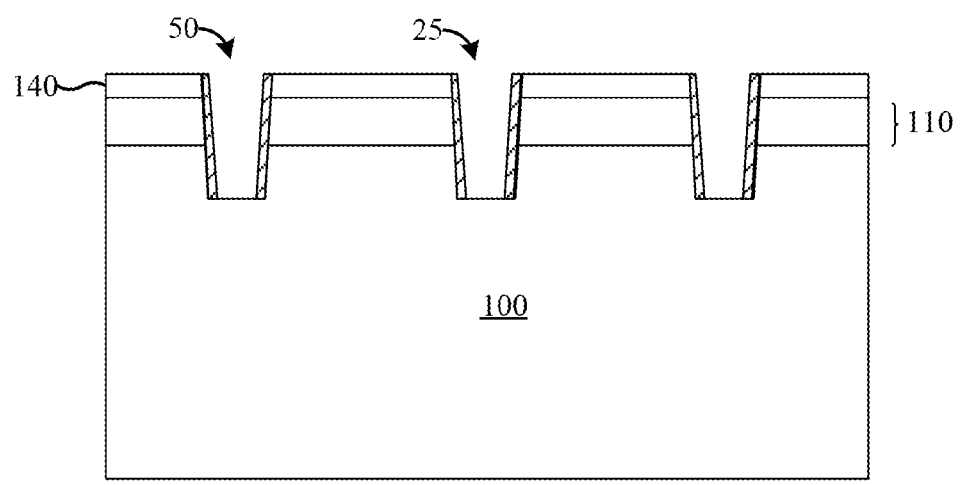
FIG. 20 illustrates a cross-sectional view of a semiconductor device after forming insulating liner along sidewalls of the trenches in accordance with the fourth alternative embodiment of the present invention.

FIGS. 19-21 illustrate an alternative embodiment showing application of the embodiments of the present invention to a plurality of discrete devices in a single chip.

In this embodiment, discrete devices within each chip may be separated using isolation regions, which are formed simultaneously with the trenches in the dicing region after forming a continuous (unpatterned) device regions 110.

FIG. 19 illustrates a cross-sectional view of a semiconductor device after forming trenches in the substrate in accordance with an alternative embodiment of the present invention.

Unlike prior embodiments, the embodiment illustrates forming a first device 110A and a second device 110B within the device regions 110. The first device 110A and the second device 110B are part of the same chip. However, prior to forming the plurality of trenches 50, the first device 110A and the second device 110B are continuously connected through the device regions 110. In other words, until the formation of the plurality of trenches 50, there is no isolation separating (or defining) the first device 110A from the second device 110B. As in prior embodiments, the plurality of trenches 50 is formed along the dicing channels, for example, as illustrated in FIG. 4B.

Along with the formation of the plurality of trenches 50 in the dicing channels, a plurality of isolation trenches 25 are formed thereby separating the device regions 110 into the first device 110A and the second device 110B. In various embodiments, the plurality of trenches 50 and the plurality of isolation trenches 25 are formed in parallel at the same time using the same mask and same etching processes.

FIG. 20 illustrates a cross-sectional view of a semiconductor device after forming insulating liner along sidewalls of the trenches in accordance with an alternative embodiment of the present invention.

As in prior embodiments, the insulating liner 125 is formed along sidewalls of the plurality of trenches 50 and the plurality of isolation trenches 25. The plurality of isolation trenches 25 lined with the insulating liner 125 isolate the first device 110A from the second device 110B in various embodiments.

Figure 21A:
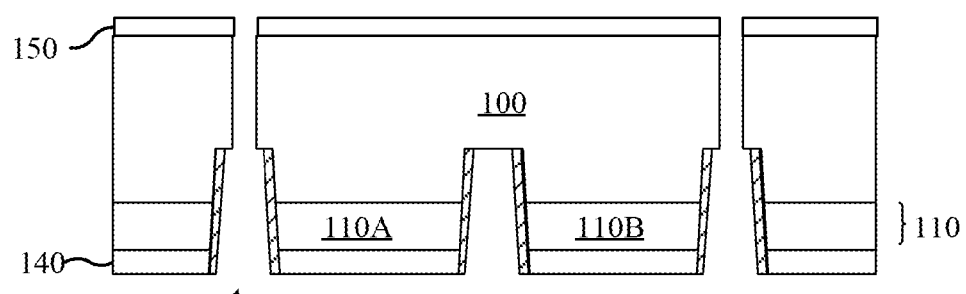
FIGS. 21A and 21B, illustrates a cross-sectional view of a semiconductor device after singulation in accordance with the fourth alternative embodiment of the present invention.
Figure 21B:
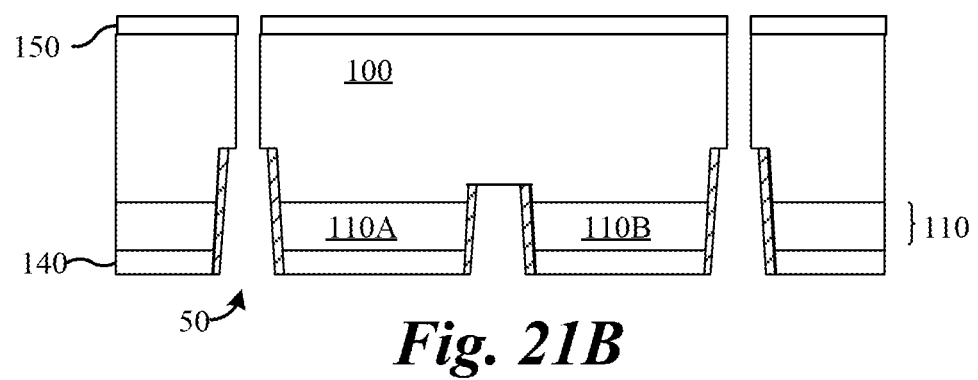

FIG. 21, which includes FIGS. 21A and 21B, illustrates a cross-sectional view of a semiconductor device after singulation in accordance with an alternative embodiment of the present invention.

Referring to FIG. 21A, the substrate 100 is thinned and singulated as described in various embodiments. However, as the plurality of isolation trenches 25 are not formed in dicing channels, these structures are a part of the final semiconductor device after singulation.

In various embodiments, it would be possible to etch plurality of trenches 50 for separation to be deeper than the isolation trenches 25 by changing the dimension of mask opening for the etching process. Consequently, the plurality of trenches 50 can be made to be deeper than the isolation trenches 25 without additional mask steps. Thus, separation by grinding may be used later while keeping the isolation trenches. This is illustrated in FIG. 21B.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, a copper intermetallic, an insulator comprising copper, and a semiconductor comprising copper.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-21 may be combined with each other in alternative embodiments. It is therefore intended that the appended claims encompass any such modifications or embodiments.

What is claimed is:

1. A method for forming a semiconductor device, the method comprising:
   forming a device region in a substrate, the device region extending continuously from one sidewall of the substrate to an opposite sidewall of the substrate;
   forming trenches in the substrate, the trenches dividing the device region into active regions;
   forming a dielectric material within the trenches, wherein each of the trenches comprises a sidewall including an upper portion and a lower portion, wherein the thickness of the dielectric material on the sidewall decreases along the sidewall from the upper portion towards the lower portion;
   forming a front side metallization layer over the device region, the front side metallization extending into the trenches and covering a top portion of the dielectric material within the trenches; and
   singulating the substrate by separating the substrate along the trenches.

2. The method of claim 1, further comprising forming isolation trenches dividing the active regions into a plurality of regions for discrete devices.

3. The method of claim 1, wherein forming the dielectric material comprises lining the upper portion of the sidewall with an insulating liner.

4. The method of claim 1, wherein the step of singulating the substrate by separating the substrate along the trenches comprises thinning the substrate from a back side to expose the trenches, wherein the back side is opposite the side with the device region.

5. The method of claim 1, wherein the step of singulating the substrate by separating the substrate along the trenches comprises thinning the substrate and dicing the substrate through the trenches.

6. The method of claim 1, wherein forming trenches comprises etching along a crystallographic direction to form V-shaped grooves.

7. The method of claim 1, wherein forming trenches comprises forming trapezoidal grooves.

8. The method of claim 1, wherein the step of forming trenches comprises forming sidewalls having substantially parallel faces.

9. The method of claim 1, wherein forming trenches comprises using a plasma etching process.

10. The method of claim 1, wherein the trenches are formed prior to forming any isolation region.

11. A method for forming a semiconductor device, the method comprising:
    forming a device region in a substrate before using an active mask step;
    after forming the device region, forming gaps along dicing channels in the substrate, the gaps dividing the device region into a plurality of active regions;
    forming a dielectric material within the gaps, wherein each of the gaps comprises a sidewall including an upper portion and a lower portion, wherein the thickness of the dielectric material on the sidewall tapers along the sidewall;
    forming a front side metallization layer over the device region, the front side metallization extending into the gaps and covering a top portion of the dielectric material within the gaps; and
    using the gaps to singulate the substrate.

12. The method of claim 11, wherein the device region is formed before using any mask step.

13. The method of claim 11, wherein the gaps are formed prior to forming any isolation region.

14. The method of claim 11, further comprising forming isolation trenches dividing the active regions into a plurality of regions for discrete devices.

15. The method of claim 11, wherein forming the dielectric material comprises lining sidewalls of the gaps with an insulating liner.

16. The method of claim 11, wherein the step of using the gaps to singulate the substrate comprises thinning the substrate from a back side to expose the gaps.

17. The method of claim 11, wherein the step of using the gaps to singulate the substrate comprises thinning the substrate and dicing the substrate through the gaps.

18. The method of claim 11, wherein forming gaps comprises etching along a crystallographic direction to form V-shaped grooves.

19. The method of claim 11, wherein forming gaps comprises forming trapezoidal grooves.

20. The method of claim 11, wherein the step of forming gaps comprises forming sidewalls having substantially parallel faces.

21. The method of claim 11, wherein the step of forming gaps comprises using a plasma etching process.

22. A method for forming a semiconductor device, the method comprising:
    forming a device region in a substrate, the device region extending continuously from one sidewall of the substrate to an opposite sidewall of the substrate;
    forming trenches in the substrate, the trenches dividing the device region into active regions;
    depositing a dielectric material liner within the trenches, wherein each of the trenches comprises a sidewall including an upper portion and a lower portion, wherein the thickness of the dielectric material liner on the sidewall decreases along the sidewall from the upper portion towards the lower portion such that a lowermost portion of the sidewalls is exposed after the depositing;
    forming a front side metallization layer over the device region, the front side metallization extending into the trenches and covering a top portion of the dielectric material liner within the trenches; and
    singulating the substrate by separating the substrate along the trenches.

23. The method of claim 22, wherein each of the trenches includes a bottom surface that has a central region and a peripheral region, wherein the central region is covered with the dielectric material liner and the peripheral region remains exposed after the depositing.

24. The method of claim 22, wherein each of the trenches includes a bottom surface comprising the dielectric material liner.

25. The method of claim 22, wherein singulating the substrate by separating the substrate along the trenches comprises thinning the substrate from a back side to expose the trenches, wherein the back side is opposite the side with the device region.

26. The method of claim 22, wherein singulating the substrate by separating the substrate along the trenches comprises thinning the substrate and dicing the substrate through the trenches.

* * * * *